US010858241B2

(12) United States Patent
Borca-Tasciuc et al.

(10) Patent No.: US 10,858,241 B2
(45) Date of Patent: Dec. 8, 2020

(54) ENHANCED CONTROL OF SHUTTLE MASS MOTION IN MEMS DEVICES

(71) Applicant: Rensselaer Polytechnic Institute, Troy, NY (US)

(72) Inventors: Diana-Andra Borca-Tasciuc, Troy, NY (US); Mona Mostafa Hella, Watervliet, NY (US); John Oxaal, Mountain View, CA (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 15/562,726

(22) PCT Filed: Apr. 7, 2016

(86) PCT No.: PCT/US2016/026353
§ 371 (c)(1),
(2) Date: Sep. 28, 2017

(87) PCT Pub. No.: WO2016/164529
PCT Pub. Date: Oct. 13, 2016

(65) Prior Publication Data
US 2018/0354780 A1    Dec. 13, 2018

Related U.S. Application Data

(60) Provisional application No. 62/144,977, filed on Apr. 9, 2015, provisional application No. 62/222,274, filed on Sep. 23, 2015.

(51) Int. Cl.
*B81B 3/00* (2006.01)
*B81C 1/00* (2006.01)

(52) U.S. Cl.
CPC .......... *B81B 3/0051* (2013.01); *B81B 3/0021* (2013.01); *B81C 1/00055* (2013.01);
(Continued)

(58) Field of Classification Search
None
See application file for complete search history.

(56) References Cited

U.S. PATENT DOCUMENTS 5,635,640 A    6/1997 Geen
5,817,942 A    10/1998 Greiff
(Continued)

OTHER PUBLICATIONS

Chiu et al., "Capacitive Vibration-To-Electricity Energy Converter with Integrated Mechanical Switches," Seventh International Workshop on Micro and Nanotechnology for Power Generation and Energy Conversion Applications (PowerMEMS 2007), Preferred Meeting Management Inc., Nov. 28-29, 2007, p. 121-124; 369.*

(Continued)

*Primary Examiner* — Anthony Ho
*Assistant Examiner* — Kevin Quinto
(74) *Attorney, Agent, or Firm* — Murtha Cullina LLP; Anthony P. Gangemi

(57) ABSTRACT

A MEMS device and a method of forming the same. A disclosed method includes: providing a silicon substrate layer, a buried oxide layer and a device silicon layer; using a microfabrication process to pattern a set of device features on the device silicon layer including a shuttle mass and an anchor frame; removing the silicon substrate layer and buried oxide below the shuttle mass; placing a shadow mask on a surface of the device silicon layer, wherein the shadow mask has an microscale opening to expose at least one device feature; and forming a nanoscale stopper on a sidewall of the at least one device feature by depositing a deposition material through the opening in a controlled manner.

7 Claims, 10 Drawing Sheets

(52) U.S. Cl.
CPC ...... *B81C 1/00119* (2013.01); *B81C 1/00388* (2013.01); *B81C 1/00531* (2013.01); *B81C 1/00714* (2013.01)

(56) References Cited

U.S. PATENT DOCUMENTS

| | | | |
|---|---|---|---|
| 6,065,341 A | 5/2000 | Ishio et al. | |
| 6,125,700 A | 10/2000 | Tsugai et al. | |
| 6,858,521 B2 | 2/2005 | Jin | |
| 6,923,062 B2* | 8/2005 | Franz | B81B 3/0051 73/514.01 |
| 8,163,657 B2 | 4/2012 | Chou et al. | |
| 2004/0014300 A1* | 1/2004 | Kouma | G02B 26/0841 438/460 |
| 2006/0272414 A1* | 12/2006 | Ayazi | B81C 1/00182 73/514.32 |
| 2007/0065967 A1 | 3/2007 | Beaudry | |
| 2012/0228725 A1 | 9/2012 | Zhang et al. | |
| 2013/0105921 A1* | 5/2013 | Najafi | G01P 15/0802 257/415 |
| 2013/0328109 A1 | 12/2013 | Lal et al. | |
| 2014/0331367 A1 | 11/2014 | Lal et al. | |
| 2014/0374856 A1* | 12/2014 | Chen | B81B 3/0059 257/418 |

OTHER PUBLICATIONS

International Search Report and Written Opinion dated Oct. 17, 2016 for PCT/US2016/026353 filed Apr. 7, 2016; pp. 15.
Le et al., "Wideband excitation of an electrostatic vibration energy harvester with power-extracting end-stops," Smart Mater. Struct., vol. 22, No. 7, p. 075020, Jul. 2013.
Chiu et al., "Capacitive vibration-to-electricity energy converter with integrated mechanical switches," J. Micromechanics Microengineering, vol. 18, No. 10, p. 104004, Oct. 2008.

* cited by examiner

ENHANCED CONTROL OF SHUTTLE MASS MOTION IN MEMS DEVICES

PRIORITY CLAIM

This application claims priority to U.S. provisional patent applications "Technique to integrate displacement limiters having nanoscale resolution in microelectromechanical (MEMS) systems," Ser. No. 62/144,977 filed on Apr. 9, 2015, and "A technique to integrate displacement limiters having nanoscale resolution in microelectromechanical (MEMS) systems" Ser. No. 62/222,274, filed on Sep. 23, 2015, the contents of which are hereby incorporated by reference.

TECHNICAL FIELD

The subject matter of this invention relates to MEMS devices, and more particularly to MEMS devices having enhanced control of the shuttle mass motion using integrated displacement limiters with nanoscale resolution and/or soft stoppers to provide frequency-up conversion.

BACKGROUND

Microelectromechanical systems (MEMS) are miniaturized devices such as sensors, valves, gears, mirrors, actuators, etc., embedded in semiconductor chips and typically integrated with electronic circuits. MEMS devices usually have a moving feature or component, e.g., a cantilever, shuttle, diaphragm, etc., that moves in response to a stimulus. Although they are designed to move in a restricted range, unpredictable external disturbances may cause the parts to exceed the range of motion they have been designed for, leading to device failure. Thus, there is a need to limit the displacement of microscale parts in dynamic MEMS devices, which is typically accomplished using integrated displacement limiters, referred to as stoppers.

Stoppers are constructed on a device so that when the moving component (i.e., shuttle mass) reaches a predetermined displacement, physical contact is made with the stopper. The stopper is connected to the a fixed or non-moving portion of the MEMS device (e.g., an anchor frame) and absorbs the impact of the shuttle mass, stopping it from moving any further in the direction it was moving. The stopper defines both the maximum displacement of the shuttle mass and the minimum gap between the shuttle mass and anchor frame.

A widely used configuration for MEMS systems employs an interdigitated capacitor, which may for example be utilized to generate power in response to external forces, such as vibration or movement or to sense a variety of external stimuli such as pressure or acceleration. In most cases, fabrication of these devices involves deep reactive ion etching (DRIE). In this process, silicon is etched through the depth of a silicon wafer with vertical sidewalls. Common features patterned in this process include shuttle masses, spring beams, interdigitated electrodes, and stoppers.

A cross-sectional view of a typical fabrication process flow for a simplified MEMS device is shown in FIG. 1(a)-(c). The illustrative device is fabricated from a silicon on insulator (SOI) wafer, encompassing a substrate of silicon 14, a layer of buried oxide 12, and a top layer of device silicon 10. In FIG. 1(a), the device layer features, including the shuttle mass 16, anchor frames 18, spring beams and electrodes (not shown), etc., are patterned with DRIE as shown. In FIG. 1(b), the silicon substrate 14 is patterned, for example removing the area under the shuttle mass 16 with DRIE. In FIG. 1(c), the buried oxide layer is released with, e.g., hydrofluoric acid, resulting in a shuttle mass 16 that can move between the two anchor frames 18.

In the process flow described in FIG. 1, which is the typical approach used in fabrication of these devices, any additional desired features that might be utilized to improve performance, such as stoppers, are also defined in the lithography process and constructed by DRIE etching. Accordingly, such features are limited to the resolution of the lithography technology, which is typically about 1 micron (μm) or larger, referred to herein as microfabrication. Accordingly, current MEMS fabrication techniques limit the size of such features, and thus limit performance.

SUMMARY

Described herein are solutions for improving MEMS performance by enhancing control of the shuttle mass movement. One technique allows for the fabrication of "nanoscale stoppers" and other MEMS features with nanoscale resolution using existing microfabrication techniques. A further technique includes the use of a structure referred to as a "soft stopper" that provides up-conversion of the frequency response of a MEMS device.

To form nanoscale stoppers, after a device has been etched (i.e., without stoppers), a shadow mask is aligned with the wafer and material is deposited on the device via microscale openings etched from the shadow mask. The areas where nanoscale stoppers are to be formed are exposed to the depositing material. In many deposition processes, such as plasma-enhanced chemical vapor deposition (PECVD), thermal evaporation, and sputtering, the material will deposit on all exposed features, including sidewall features. The thickness deposited on the sidewall can be controlled, through deposition parameters (time, flow rates, temperature, etc.) with high precision allowing for nanoscale resolution of the side wall deposition defining the nanoscale stoppers.

Soft stoppers can be implemented independently or in conjunction with nanoscale stoppers to increase MEMS device lifespan, and increase performance with a frequency-up conversion that increases the bandwidth of the device.

In a first aspect, the disclosure provides a method of forming a MEMS device, comprising: providing a substrate, an insulator on the substrate and a device silicon layer on the insulator; using a microfabrication process to pattern a set of device features on the device silicon layer including a shuttle mass and an anchor frame; removing the substrate and insulator adjacent the shuttle mass; placing a shadow mask on a surface of the device silicon layer, wherein the shadow mask has a microscale opening to expose at least one device feature of the device silicon layer; and forming a nanoscale stopper on a sidewall of the at least one device feature by depositing a deposition material through the microscale opening.

In a second aspect, the disclosure provides a MEMS device, comprising: a movable feature that moves relative to a fixed feature; a nanoscale stopper that engages and prevents the movable feature from touching the fixed feature as the movable features moves toward the fixed feature, wherein the nanoscale stopper has a thickness of less than 1000 nanometers; and a soft stopper that engages the movable feature before the movable feature engages the nanoscale stopper, wherein the soft stopper slows the movable feature relative to the fixed feature.

In a third aspect, the disclosure provides a wireless microsensor, comprising: a sensor for sensing an environmental condition; and a MEMS device for harvesting energy and powering the sensor, wherein the MEMS device comprises: a movable feature that moves relative to a fixed feature; a nanoscale stopper that engages and prevents the movable feature from touching the fixed feature as the movable features moves toward the fixed feature, wherein the nanoscale stopper has a thickness of less than 1000 nanometers; and a soft stopper that engages the movable feature before the movable feature engages the nanoscale stopper, wherein the soft stopper slows the movable feature relative to the fixed feature.

In a fourth aspect, the invention provides a MEMS device, comprising: a movable feature that moves relative to a fixed feature; a stopper that limits motion of the movable feature in a first direction; and a soft stopper that includes at least one cantilever beam that engages and slows the movable feature in the first direction before the movable feature reaches the stopper.

BRIEF DESCRIPTION OF THE DRAWINGS

These and other features of this invention will be more readily understood from the following detailed description of the various aspects of the invention taken in conjunction with the accompanying drawings in which.

Figure 1A:
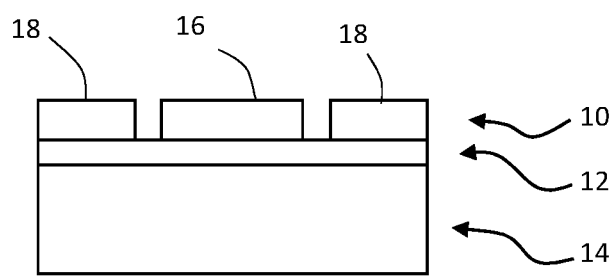
FIGS. 1(a), (b), (c) depict a cross-sectional view of a process for fabricating a MEMS device.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 2:
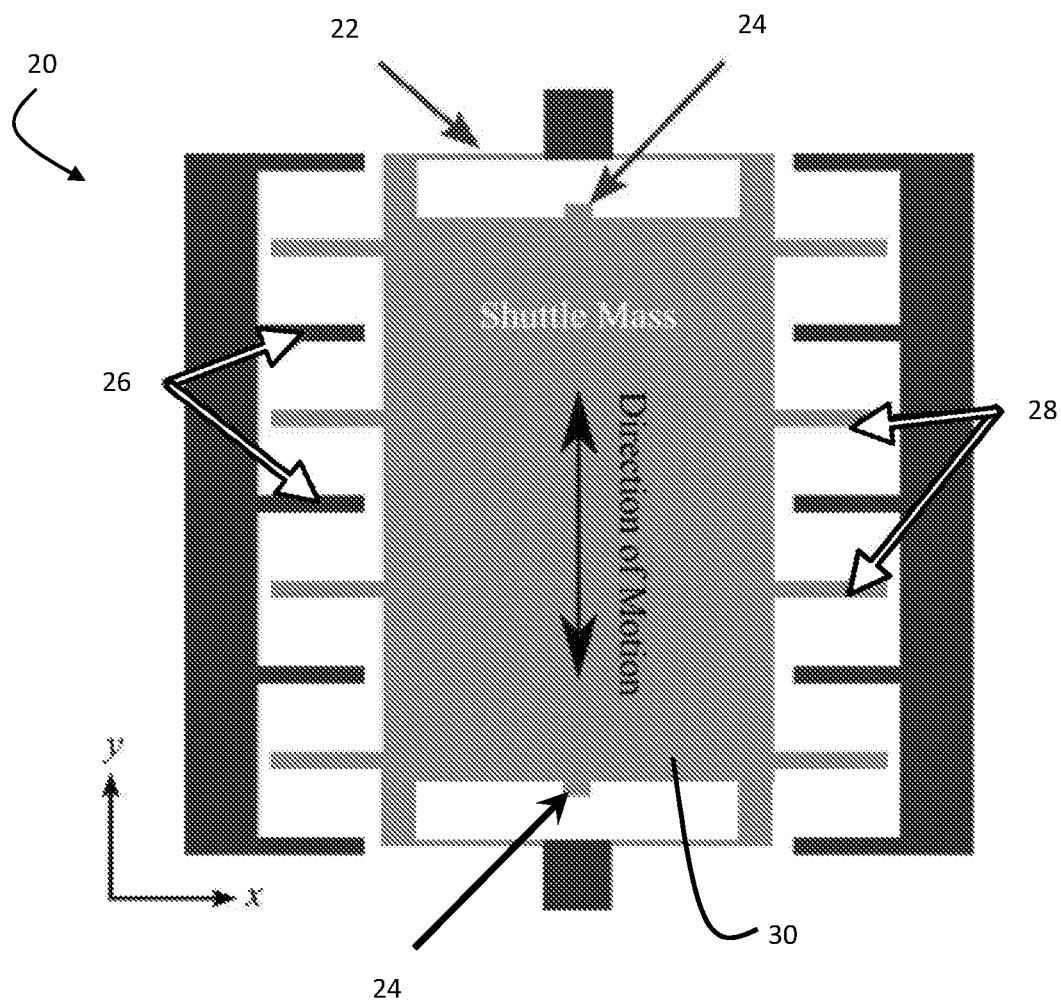
FIG. 2 depicts a top view of a fabricated MEMS device according to embodiments.

FIG. 2 depicts an example of a power harvesting MEMS device 20, shown in top view, fabricated according to a microfabrication process such as that described above. MEMS device 20 generally includes a movable feature such as a shuttle mass 30, spring beams 22, interdigitated electrodes including fixed electrodes 26 and movable electrodes 28, and stoppers 24. The shuttle mass 30 is suspended by the spring beams 22, and the interdigitated electrodes 26, 28 form a capacitor. In-plane motion of the shuttle 30 will cause the gaps between the electrodes 26, 28 to vary, which in turn varies the capacitance between them. When used in conjunction with appropriate integrated circuits, the capacitance variation may be used to increase in electrical potential of a storage capacitor or a battery. Alternatively, a voltage applied across the electrodes 26, 28 will produce a defined displacement of the shuttle mass 30.

The total device capacitance is calculated by adding the capacitances between all the electrode pairs. As is known, achieving smaller minimum gaps during operation leads to larger maximum capacitance, and consequently larger capacitance variation, which improves performance when employing these devices in most applications. In many current device designs, the stoppers 24 on the device 20 define the minimum possible gap between the electrodes 26, 28 and prevent device failure resulting from the moving 28 and fixed electrodes 26 contacting each other. Thus, the thickness of the stoppers 24 dictates the maximum capacitance, which in turn has a direct effect on device performance. As noted, feature size of stoppers 24 or the like are generally limited by the resolution of the technology, i.e., 1 μm or more using microfabrication techniques based on deep reactive ion etching (DRIE).

Figure 1B:
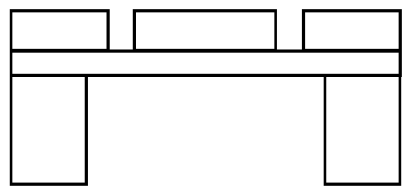
Figure 1C:
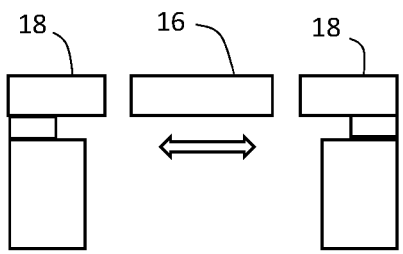
Figure 3:
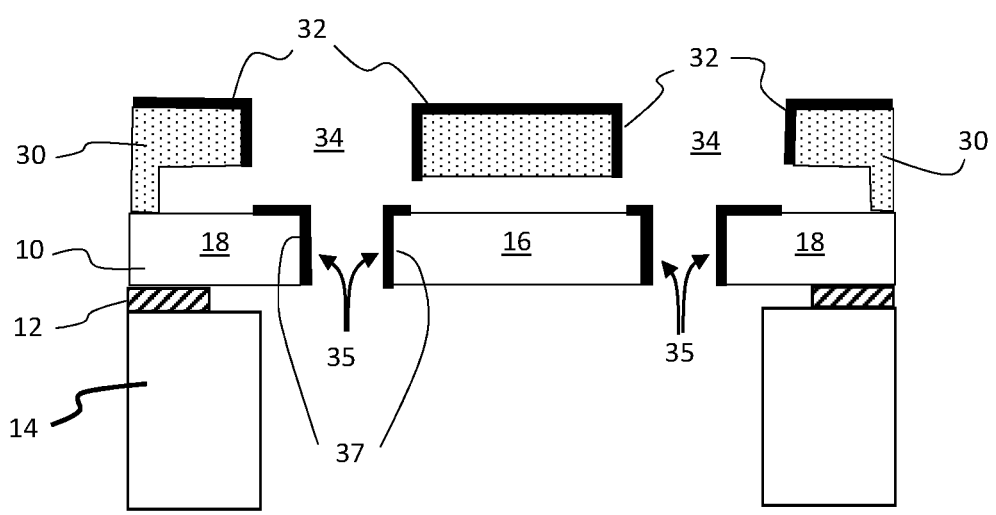
FIG. 3 depicts a cross-sectional view of the MEMS device of FIG. 1 having nanoscale stoppers fabricated from coated sidewalls according to embodiments.

The present approach allows stoppers 24 and other such features to be fabricated with nanoscale resolution (e.g., less than 1000 nanometers) using existing microfabrication techniques based on thin film deposition. FIG. 3 depicts an example of this process with reference to the generic MEMS device depicted in FIG. 1. In this new process, after the MEMS device has been etched (without stoppers, etc., as shown in FIG. 1), a shadow mask 30 is aligned with the wafer and stopper material is deposited on the device silicon 10, such as that shown in the cross-sectional (side) view of FIG. 3. The shadow mask 30 has microscale openings 34 that allow a deposition material 32 to go through and deposit on the sidewalls 37 of the shuttle mass 16 and anchors 18. Using a technique where a controlled amount of deposition material 32 is provided, nanoscale features, such as stoppers and the like can be formed on any of the sidewalls 37 of the device.

This process results in nanoscale stoppers 35 being formed on the sidewalls 37 between the anchor frames 18 and shuttle mass 16, which are exposed to the deposition material 32. In many deposition processes, such as plasma enhanced chemical vapor deposition (PECVD), thermal evaporation, and sputtering, the deposition material 32 will deposit on sidewall features, although at a slower rate compared to the top surfaces. The thickness deposited on the sidewall can be controlled, through deposition parameters (time, flow rates, temperature, etc.) with high precision allowing for nanoscale resolution of the side wall thickness defining the nanoscale stoppers 35.

Figure 4:
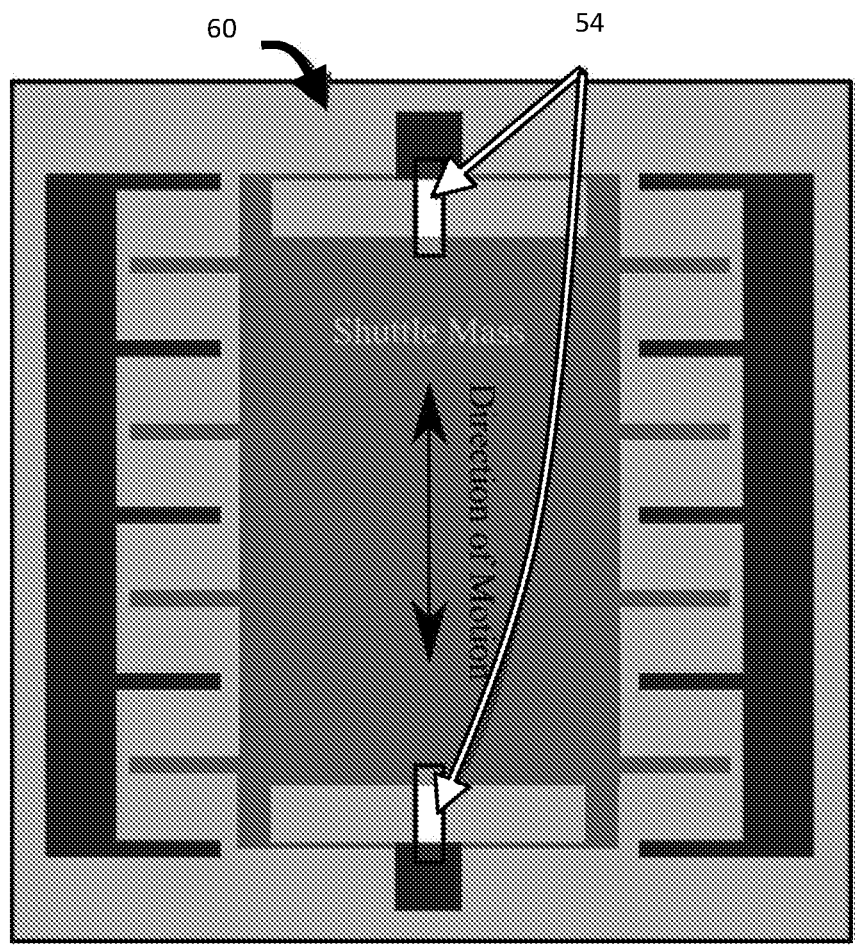
FIG. 4 depicts a top view of a MEMS device having a shadow mask used for fabricating nanoscale stoppers according to embodiments.

FIG. 4 shows an energy harvesting MEMS device similar to that depicted in FIG. 2 with a microscale shadow mask 60 on top. As can be seen, the mask includes two openings 54 through which deposition material is allowed to pass. The size and location of the openings 54 may change depending on the application and parameters used during the deposition process. For example, rather than locating stoppers at the ends of the shuttle mass, stoppers may be placed at other locations, such as on the electrodes 26, 28 (FIG. 3).

Figure 5:
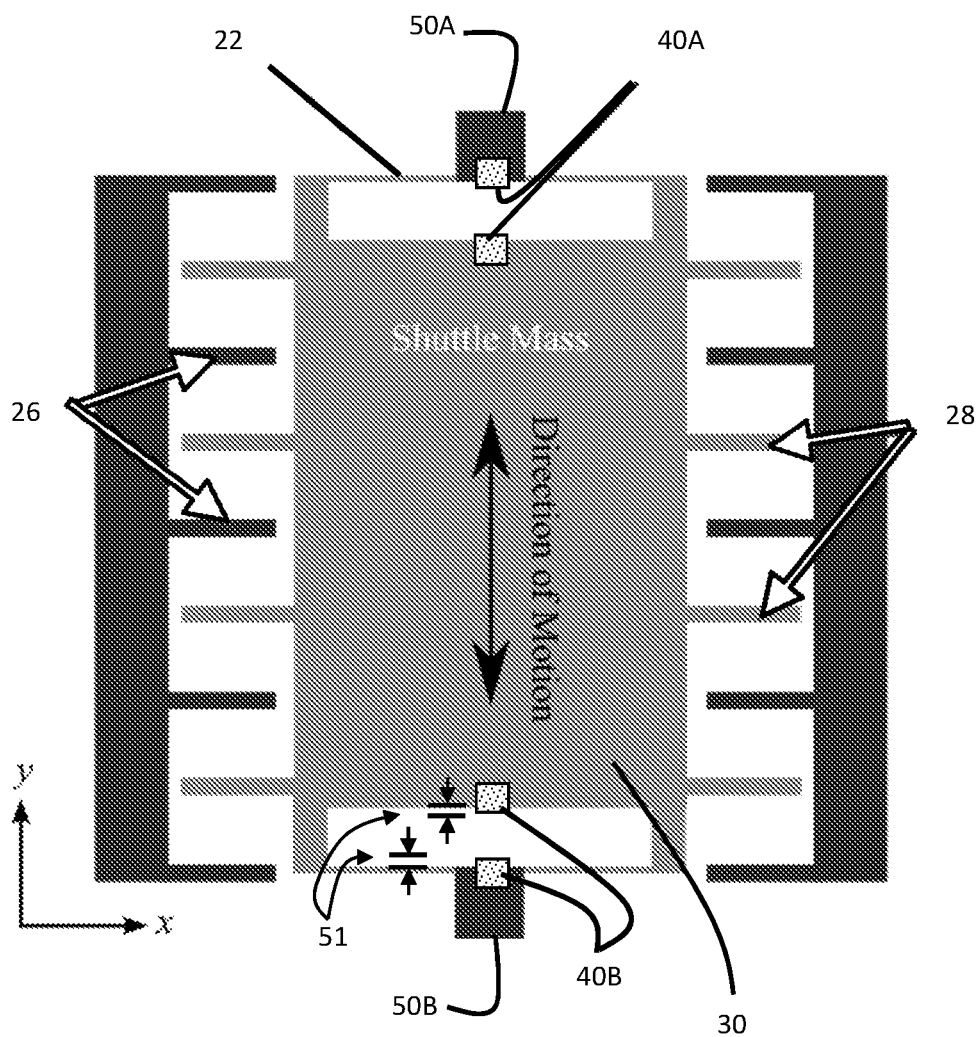
FIG. 5 depicts a top view of a MEMS device having stoppers formed using the shadow mask of FIG. 4.

FIG. 5 shows a resulting device with the sidewall deposited nanoscale stoppers 40A, B. In this example, nanoscale stoppers 40A, B limit motion in each direction and include a section formed on the shuttle mass 30 and a section on each anchor 50A, B. Thus, for example, each stopper section may be implemented with a 50 nanometer thick material 51 on each sidewall, such that the total limit for the displacement of the shuttle mass in either direction is 100 nanometers. It is however understood that stoppers 40A, B may be implemented with different dimensions.

Figure 6:
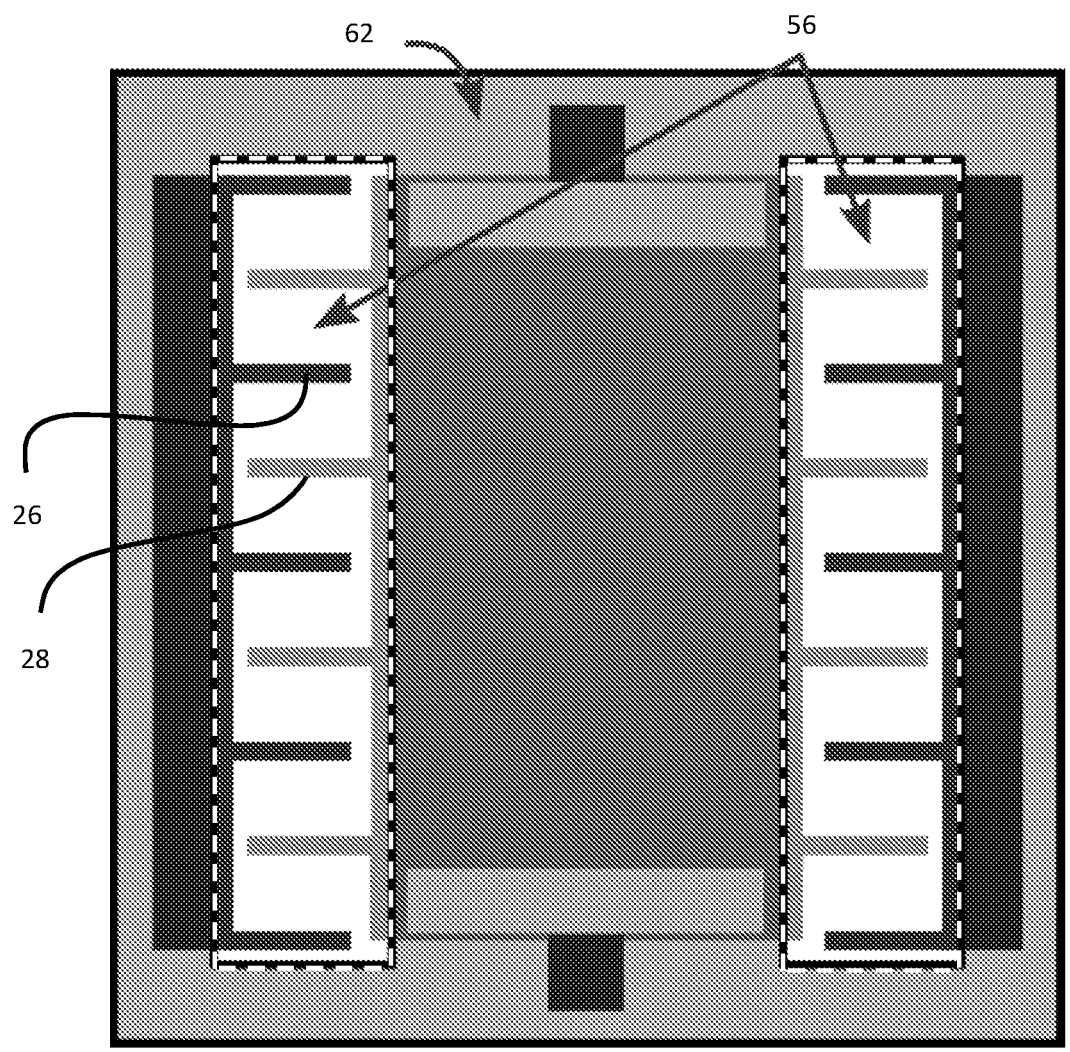
FIG. 6 depicts a top view of a MEMS device having a shadow mask used for fabricating nanoscale stoppers on electrodes according to embodiments.

It is also understood that the stoppers 40A, B may be located elsewhere on the MEMS device. For example, FIG. 6 depicts a shadow mask 62 placed on top of the device silicon layer having openings 56 over the interdigitated electrodes 26, 28. Using this configuration, stoppers can be formed on the sidewalls of the interdigitated electrodes 26, 28. With this configuration, stopper material applied through the shadow mask 62 will coat the sidewalls of the interdigitated electrodes 26, 28 with a predetermined thickness, thus allowing a coating on the electrodes 26, 28 to act as stoppers.

Regardless of the location, the stopper material may comprise any material deposited in a cleanroom environment that can coat sidewalls including, e.g., silicon oxide (SiO2), silicon nitride (SiN), and paralyne. The stopper thickness is controllable and dependent on the deposition parameters such as deposition time, gas flow rates, and temperature. The shadow mask 62 may utilize any microscale geometry that exposes sidewall features in a MEMS device. As noted, the nanoscale stoppers may be located anywhere on the device, including, e.g., the shuttle, electrodes, springs, etc. The use of nanoscale stoppers may be applied to limit in-plane motion, as well as limit linear or angular motion. The described approach thus allows for the control of minimum gap and maximum displacement with nanoscale resolution. Illustrative uses of MEMS fabricated with this process include sensors, microphones, accelerometers, gyroscopes, actuators, power harvesters, seismic sensors (e.g., for oil and gas exploration), motes, personal devices, smart clothing, etc.

Figure 7:
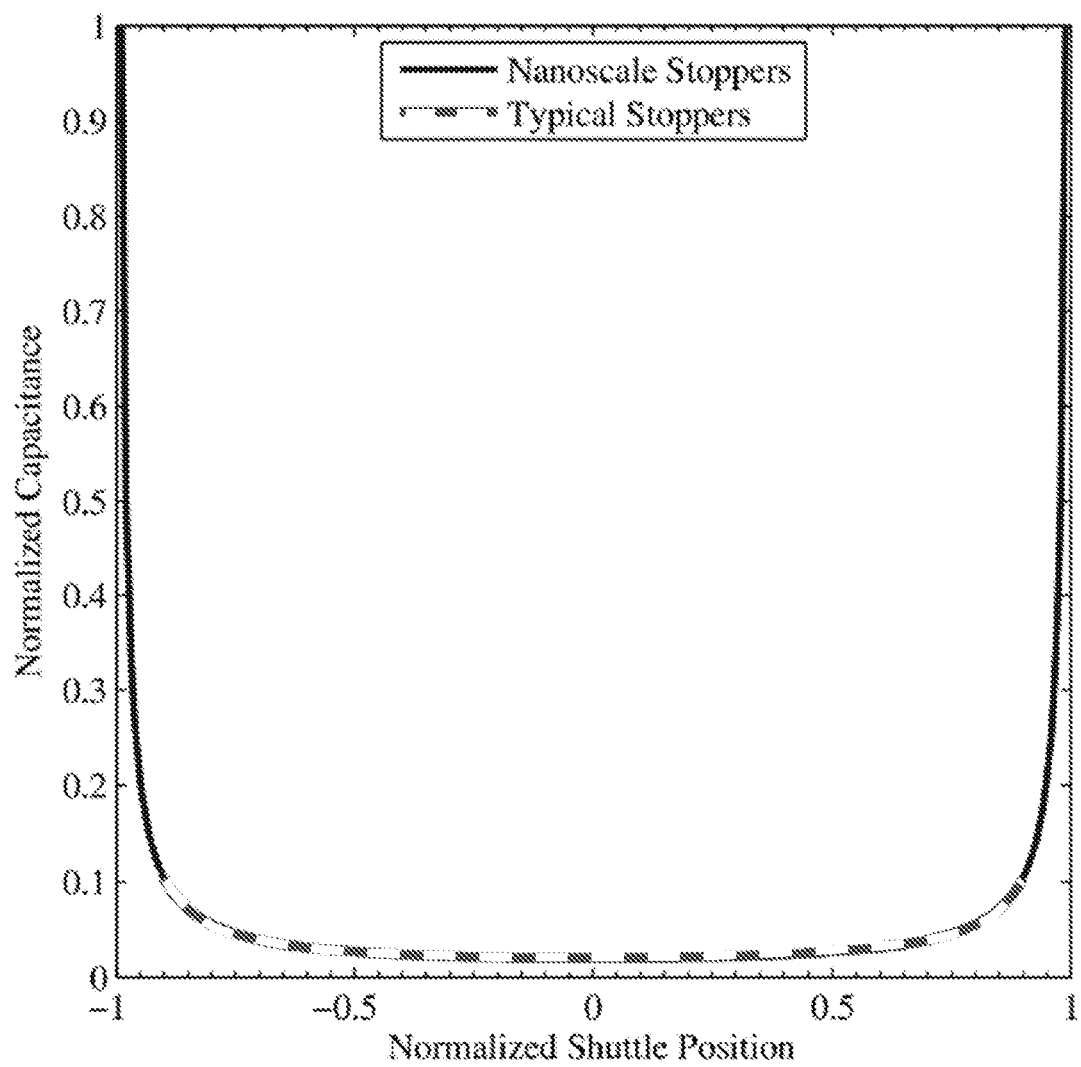
FIG. 7 depicts a graph showing normalized capacitance of nanoscale stoppers versus typical stoppers.

As noted, one advantage of nanoscale stoppers is the ability to control the minimum gap between interdigitated electrodes 26, 28. This is equivalent to controlling the maximum capacitance and can have application in any MEMS device that uses variable capacitors such as pressure and force sensing, actuation, or power harvesting. A comparison of the capacitance of a MEMS device versus shuttle mass position with typical micro-fabricated stoppers and the new nanoscale stoppers is shown in FIG. 7. The microscale stoppers allow for a minimum gap of about 1 µm and the nanoscale stoppers allow for a minimum gap of under 1000 nm and as little as 10 nm or less. The ability to reduce the gap greatly increases the effectiveness of the device. For instance, a 100 nm minimum gap results in a 10× increase in maximum capacitance relative to a one micron gap, thus an order of magnitude increase in device operational range.

Soft Stoppers

In a further embodiment, performance may also be enhanced by employing a "soft stopper" in a MEMS device, which slows down the shuttle mass before the electrodes reach maximum displacement. The soft stoppers serve various functions. First, when they are implemented in conjunction with nanoscale stoppers, they will decrease the force before the impact of the shuttle mass (or electrodes, etc.) with the nanoscale stoppers, which will help decrease the wear that the nanoscale stoppers experience due to the impact and thus increase the lifespan of the device. Secondly, soft stoppers can be used to increase the operational frequency range of the device resulting an effect referred to as frequency-up conversion of the device resonant response. The latter can significantly improve the performance of the device in many applications. For example, power output and performance of energy harvesting MEMS devices is directly proportional to device frequency; higher frequency results in higher power. Finally, soft stoppers can also help prevent device failure due to pull in, which occurs when the moving electrodes get "stuck" in position near the stationary electrodes.

In one illustrative embodiment, soft stoppers can be achieved by etching one or more cantilever stopper beams on the anchor frame that impact the shuttle mass before the displacement maximum is reached. On impact, the beams deflect in a manner similar to the primary flexures or spring beams that support the shuttle mass, increasing the overall stiffness of the system.

Figure 8:
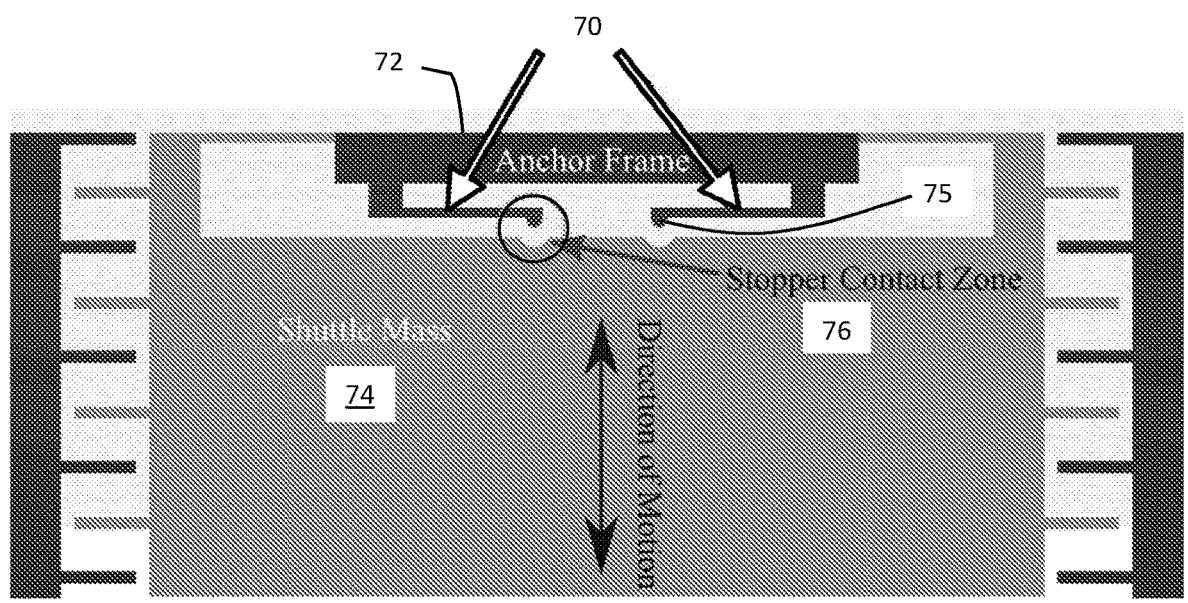
FIG. 8 depicts a top view of a MEMS device having a soft stopper according to embodiments.

FIG. 8 depicts an illustrative embodiment of a MEMS device having cantilever stopper beams 70 attached to the anchor frame 72. The cantilever stopper beams 70 may optionally include protrusions 75 and corresponding indents at contact zones 76 in the shuttle mass 74. However, such protrusions and indents are not required.

The increase in stiffness serves several purposes as mentioned herein, including:

1. When soft stoppers are implemented in conjunction with nanoscale stoppers, they reduce the shuttle mass velocity before impact with the nanoscale stoppers, thus reducing impact forces which can cause wear and tear.

2. By increasing the stiffness of the device, the operational frequency range of the device is increased resulting in an effect referred to as frequency-up conversion. This is because higher spring stiffness correlates to higher resonant frequency. In general, if an increase in displacement causes an increase in spring stiffness, this is called spring hardening, a phenomenon thoroughly studied in dynamics and mechanical systems, which can result in frequency-up conversion, increasing the operational bandwidth of the device.

3. The soft stoppers can provide an opposing force against the electrostatic pull-in force from the charged electrodes. If pull-in does occur, the springing effect of the soft stoppers can aid in pushing the shuttle mass 74 in the opposite direction.

In the example of FIG. 8, cantilever beams 70 are etched in the anchor frame and a contact zone 76 is optionally etched in the shuttle mass 74. Each beam 70 may include a protrusion at the end to initiate contact. The displacement at which the beam contacts the cantilever beam (e.g., at least one micron) is less than the maximum displacement determined by the nanoscale stoppers, e.g., less than 1000 nanometers (not shown). The stiffness of the beams can be controlled by their geometry and dimensions, therefore allowing for flexibility in design choice. Although shown as a pair of beams, any number of beams may be utilized.

Figure 9:
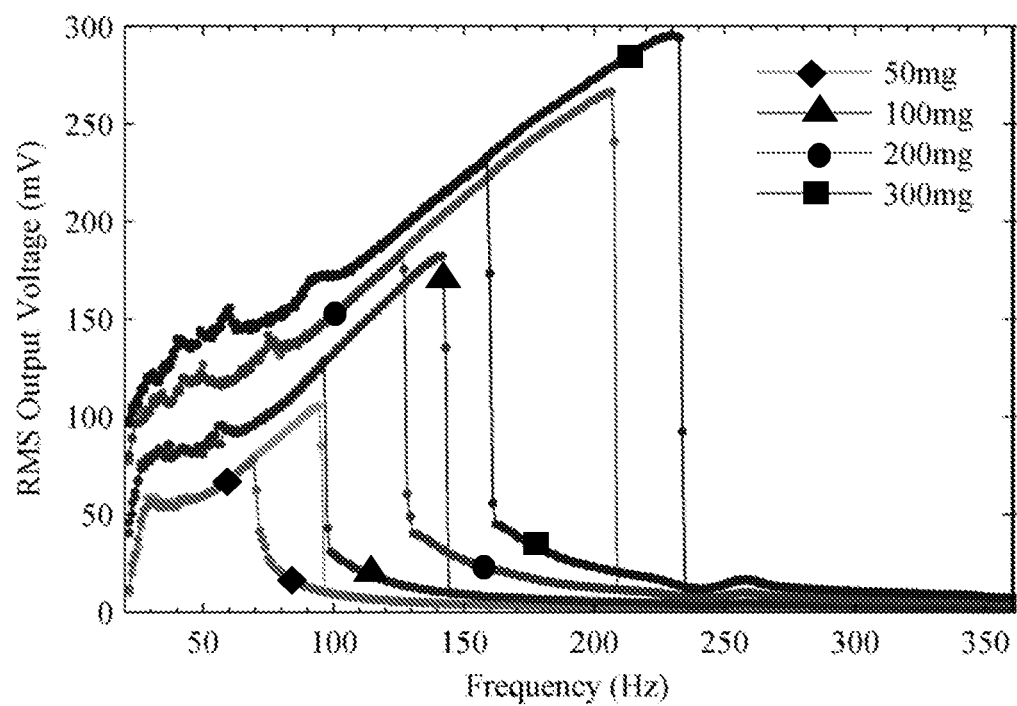
FIG. 9 depicts a plot of output voltage versus frequency of a MEMS device.

FIG. 9 shows the voltage output of a resonating MEMS device during a vibration frequency sweep at different acceleration levels in mili-g (mg) (where g is the gravitation acceleration constant 9.81 m/s2). The long slanted curves increase in amplitude as the frequency sweeps up. With an increase in the vibration acceleration level the bandwidth also increases, allowing for a larger range of driving frequencies that can cause the device to resonate.

Figure 10:
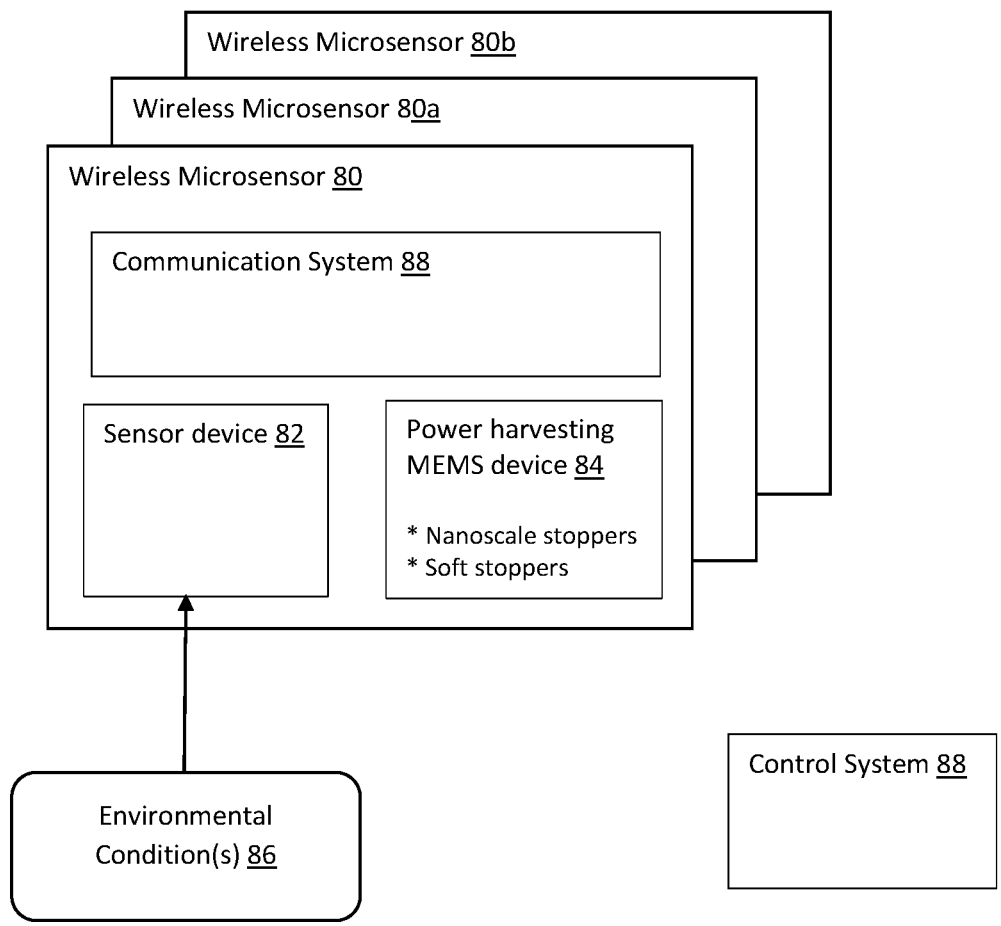
FIG. 10 depicts a microsensor network having a MEMS device according to embodiments.

FIG. 10 depicts a network of wireless microsensors 80, 80a, 80b. Each microsensor is self-powered with a power harvesting MEMS device 84 that generates power in response to an external force, such as a vibration. Each MEMS device 84 includes at least one of a nanoscale stopper and/or a soft stopper, as described herein. As shown, a sensor device 82 is provided that senses one or more environmental conditions (e.g., temperature, air flow, light, pressure, etc.) and communicates information either to other wireless microsensors in the network or e.g., a control system 88. Such a network can be used in any number of applications, e.g., smart buildings, vehicles, smart appliances, object part of the Internet of Things, smart clothing, etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims. Note that for the purposes of this disclosure, the term shuttle mass refers to any type of movable component in a MEMS device.

The invention claimed is:

1. A method of forming a microelectronic mechanical system (MEMS) device, comprising:
   providing a substrate, an insulator on the substrate and a device silicon layer on the insulator;
   using a microfabrication process to pattern a set of device features on the device silicon layer including a shuttle mass, an anchor frame, and at least one cantilever beam configured to act as a soft stopper in the MEMS device, the at least one cantilever beam having a connection end connected to the anchor frame and a free end substantially perpendicular to the connection end;
   removing the substrate and insulator adjacent and under the shuttle mass;
   placing a shadow mask on a surface of the device silicon layer, wherein the shadow mask has a microscale opening to expose at least one device feature of the device silicon layer; and
   forming a nanoscale stopper on a sidewall of the at least one device feature by depositing a deposition material through the microscale opening;
   wherein the at least one cantilever beam is configured such that a displacement of the shuttle mass at which the shuttle mass contacts the at least one cantilever beam is less than a maximum displacement of the shuttle mass determined by the nanoscale stopper.

2. The method of claim 1, wherein the at least one device feature includes interleaved electrodes.

3. The method of claim 1, wherein the removing includes deep reactive ion etching (DRIE), and wherein the substrate comprises a silicon substrate and the insulator includes buried oxide.

4. The method of claim 1, wherein the deposition material is selected from a group consisting of: silicon oxide (Si02), silicon nitride (SiN), and paralyne.

5. The method of claim 1, wherein a thickness of the nanoscale stopper is between 50 and 1000 nanometers.

6. The method of claim 1, wherein the microscale opening is at least one micron wide.

7. The method of claim 1, wherein the free end of the at least one cantilever beam having a protrusion located to engage a contact zone on the shuttle mass.

* * * * *